US006493815B1

United States Patent
Kim et al.

(12)

(10) Patent No.: US 6,493,815 B1
(45) Date of Patent: Dec. 10, 2002

(54) INTERLEAVING/DEINTERLEAVING DEVICE AND METHOD FOR COMMUNICATION SYSTEM

(75) Inventors: Min Goo Kim, Kyonggi-do (KR); Beong-Jo Kim, Kyonggi-do (KR); Young-Hwan Lee, Kyonggi-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/472,453

(22) Filed: Dec. 27, 1999

(30) Foreign Application Priority Data

Dec. 26, 1998 (KR) .......................................... 98-59068

(51) Int. Cl.[7] .............................................. G06F 12/00
(52) U.S. Cl. .......................... 711/217; 711/5; 711/203; 711/218; 714/756; 714/790; 370/335; 375/265
(58) Field of Search ............................ 711/5, 203, 217, 711/218; 714/756, 790; 370/335, 342, 441, 479; 375/140, 145, 149, 240.27, 253, 265

(56) References Cited

U.S. PATENT DOCUMENTS 5,652,861 A * 7/1997 Mayo et al. ................. 711/157
5,966,727 A * 10/1999 Nishino ...................... 711/104

* cited by examiner

Primary Examiner—Matthew Kim
Assistant Examiner—Pierre M. Vital
(74) Attorney, Agent, or Firm—Dilworth & Barrese, LLP

(57) ABSTRACT

An interleaving method comprises storing input data in a memory according to a sequential address; providing a virtual address determined by adding a predetermined value to a size of the input data so that a partial bit reversal ordering interleaving rule is satisfied; matching the virtual address to an address interleaved according to the interleaving rule; and reading the input data from the memory using an address other than the address corresponding to the specific value, out of the interleaved addresses.

8 Claims, 7 Drawing Sheets ns such as
INTERLEAVING/DEINTERLEAVING DEVICE AND METHOD FOR COMMUNICATION SYSTEM

BACKGROUND OF THE INVENTION

1. Field of the Invention

The present invention relates generally to an interleaving/deinterleaving device and method, and in particular, to an interleaving/deinterleaving device and method for a turbo encoder used in radio communication systems such as satellite, ISDN (Integrated Services Digital Network), digital cellular, W-CDMA (Wideband Code Division Multiple Access), IMT-2000 and W-ATM (Wideband Asynchronous Transfer Mode) communication systems.

2. Description of the Related Art

In a turbo encoder, interleaving is performed to randomize information input to the encoder and to improve the distance property of a codeword. In particular, it is expected that the turbo encoder will be used in a supplemental channel (or traffic channel) of an IMT-2000 (or CDMA-2000) communication system and in a data channel of a UMTS (Universal Mobile Telecommunication System) as proposed by the ETSI (European Telecommunication Standards Institute). Thus, a method for embodying an interleaver for this purpose is required. In addition, the use of turbo encoders results in an increase in the reliability of a digital communication system, and in particular, in a performance improvement of existing and future digital mobile communication systems.

The turbo encoder encodes an input frame of L information bits into parity symbols using two simple parallel concatenated codes, typically using recursive systematic convolutional (RSC) codes for component codes.

FIG. 7 shows a common turbo encoder, which is disclosed in detail in U.S. Pat. No. 5,446,474, issued on Aug. 29, 1995, which is hereby incorporated by reference.

Referring to FIG. 7, the turbo encoder includes a first component encoder 11 for encoding input frame data, an interleaver 12 for interleaving the input frame data, and a second component encoder 13 for encoding an output of the interleaver 12. A RSC encoder is typically used for the first and second component encoders 11 and 13. Further, the interleaver 12 has the same size frame as the input information bit frame, and rearranges the sequence of the information bits provided to the second component encoder 13 to reduce a correlation between the information bits.

Various interleavers have been proposed for the internal interleaver (or a turbo interleaver) 12 of the turbo encoder, such as a PN (Pseudo Noise) random interleaver, random interleaver, block interleaver, non-linear interleaver, and S-random interleaver. However, thus far, such interleavers are mere algorithms designed to improve the performance of the system based on scientific research, rather than actual implementation. Therefore, when implementing an actual system, the hardware implementation complexity must be taken into consideration. A description will now be made of the properties and problems associated with the conventional interleaver for the turbo encoder.

Performance of the turbo encoder is dependent upon the internal interleaver. In general, it is not possible to design an interleaver guaranteeing optimal performance of the system because an increase in interleaver size requires a geometric increase in calculations. Therefore, in general, the interleavers are implemented by determining conditions satisfying several given criteria. The criteria are as follows:

Distance Property: The distance between adjacent codeword symbols should be maintained to a certain extent. Since this has the same function as a codeword distance property of the convolutional code, it is preferable that the interleaver be designed to have a longer distance, if possible.

Weight Property: The weight of a codeword corresponding to a non-zero information word should be higher than a threshold value. Since this has the same function as the minimum distance property of the convolutional code, it is preferable that the interleaver be designed to have a greater weight, wherever possible.

Random Property: The correlation factor between output word symbols after interleaving should be much lower than a correlation factor between original input word symbols before interleaving. That is, randomization between the output word symbols should be completely performed. This has a direct effect on improving the quality of extrinsic information generated during continuous decoding.

Although the above three design criteria are applied to the turbo interleaver, the properties are not definitely analyzed. According to experiments, the random interleaver is superior in performance to the block interleaver. However, the random interleaver is disadvantageous in that an increase in the variety and size of the frame causes an increase in the required memory capacity for storing an interleaver index (i.e., mapping rule or address). Therefore, taking the hardware size into consideration, it is preferable to employ an enumeration method for reading data stored at a corresponding address by generating an address at every symbol clock using an index generating rule rather than a look-up table method for storing the interleaver index.

In conclusion, when various interleaver sizes are required and the hardware implementation complexity is limited in the IMT-2000 or UTMS system, the turbo interleaver should be designed to guarantee the optimal interleaver performance by taking the limitations into consideration. That is, it is necessary to define an address generating rule and then perform interleaving/deinterleaving according to the address generating rule. Of course, the interleaver should be designed to completely satisfy the above stated turbo interleaver's properties.

The IMT-2000 or UMTS specification has not yet given any definition to the turbo interleaver. The forward link and the reverse link defined by the IMT-2000 specification have various types of logical channels and various interleaver sizes. Therefore, in order to meet these varying requirements, an increase in memory capacity is required. For example, in a N=3 forward link transmission mode, an interleaver of various sizes ranging from 144 bits/frame to 36864 bits/frame may be used.

To sum up, the prior art has the following disadvantages.

First, for the conventional internal interleaver of the turbo encoder, PN random interleavers, random interleavers, block interleavers, non-linear interleavers, and S-random interleavers may be used. However, such interleavers are mere algorithms designed to improve their performances based on scientific research rather than actual implementation. Therefore, when implementing an actual system, the hardware implementation complexity of such interleavers must be considered. However, this is not specifically defined.

Second, since a controller (CPU or host) of the transceiver stores interleaving rules according to the respective interleaver sizes in the conventional interleaving method using a look-up table, a host memory requires a separate capacity in addition to an interleaver buffer. That is, when the frame size varies and increases in size, an increased memory capacity for storing the interleaver index (i.e., mapping rule or address) is required.

Third, it is not easy to implement an interleaver satisfying both the distance property and the random property.

Fourth, a detailed turbo interleaver design specification for the turbo encoder of the CDMA-2000 forward link is not established yet.

SUMMARY OF THE INVENTION

It is, therefore, an object of the present invention to provide a device and method for interleaving/deinterleaving data of various sizes in a communication system.

It is another object of the present invention to provide an interleaving/deinterleaving device and method satisfying all the properties of a turbo encoder, including the distance property, weight property and random property, in a communication system.

It is yet further another object of the present invention to provide an offset controlled interleaving/deinterleaving device and method in a communication system.

To achieve the above objects, an interleaving method is provided which comprises storing input data in a memory according to a sequential address; providing a virtual address determined by adding an offset value to a size of the input data so that an interleaving rule is satisfied; matching the virtual address to an address interleaved according to the interleaving rule; and reading the input data from the memory using an address other than the address corresponding to the specific value, out of the interleaved addresses.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail to avoid obscuring the invention in unnecessary detail.

An interleaver according to the present invention sequentially stores input data in a memory, and outputs the stored data by permuting the sequence of the data bits according to a partial bit reversal ordering algorithm. When the size of the input data is not proper for the partial bit reversal ordering algorithm, interleaving is performed using a virtual address size determined by adding a given value (hereinafter, referred to as an offset value (OSV)) to the size of the input data. Therefore, the interleaver proposed by the invention requires an interleaver memory (comprised of an input data buffer and an output data buffer), an offset controlled interleaving block (comprised of a partial bit reversal interleaver and a comparator), and an up/down-counter.

Figure 1:
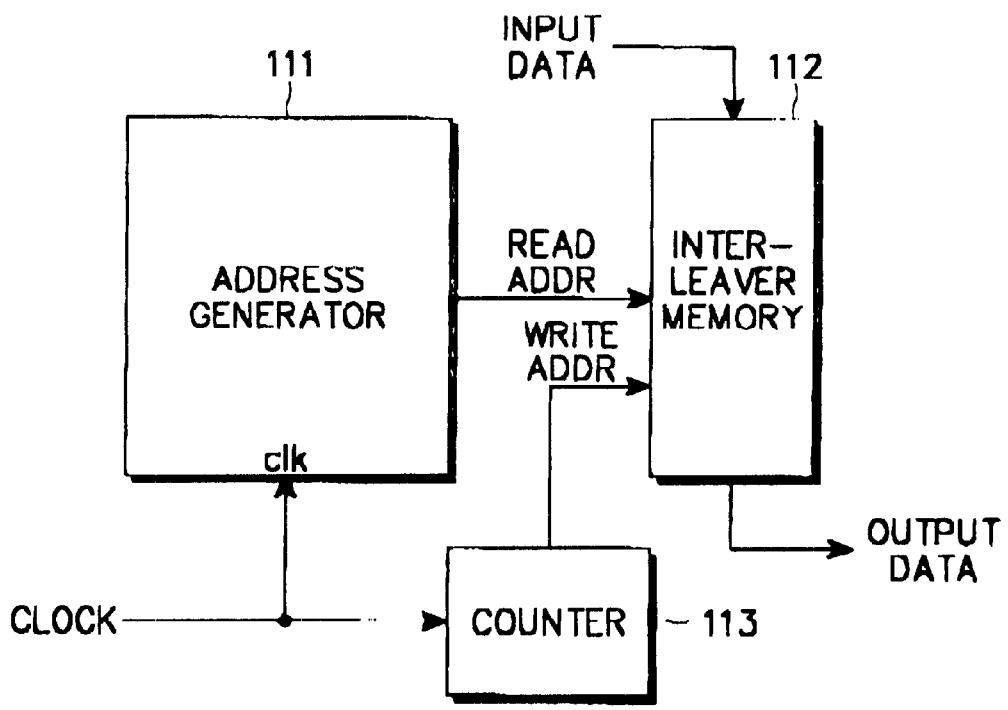
FIG. 1 is a block diagram illustrating an interleaving device in a communication system according to an embodiment of the present invention.

FIG. 1 shows an interleaver according to an embodiment of the present invention. Referring to FIG. 1, an address generator 111 receives an interleaver size value N, a first variable m, a second variable J and a clock, to generate a read address for reading bit symbols sequentially stored in an interleaver memory 112 according to an offset controlled interleaving algorithm. Here, the interleaver size N, and the first and second variables m and J are parameters determined by an input data size L. The invention is based on a partial bit reversal ordering algorithm. Therefore, when the input data size L meets the size requirement for performing the partial bit reversal ordering algorithm, a virtual interleaver size N is determined by adding the offset value OSV to the input data size L, and then the parameters (i.e., the first and second variables) for performing the partial bit reversal ordering algorithm are calculated using the virtual interleaver size N. The interleaver memory 112 sequentially stores input bit symbols in a write mode of operation, and outputs the bit symbols according to the address provided from the address generator 111 in a read mode of operation. A counter 113 counts the input clock and provides the clock count value to the interleaver memory 112 as a write address value.

Figure 2:
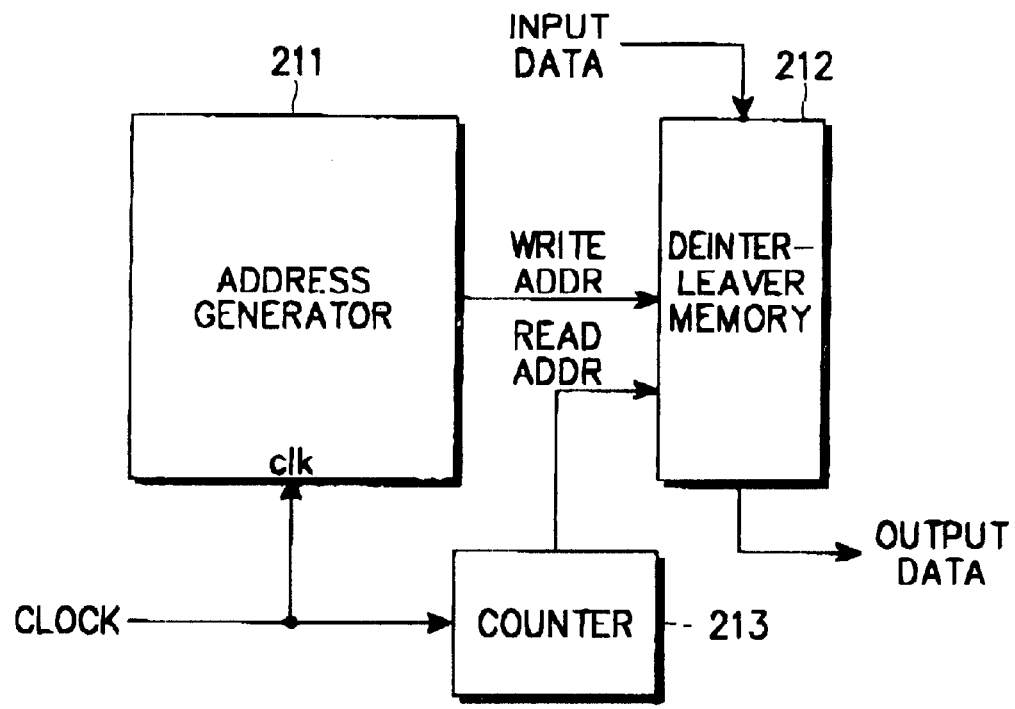
FIG. 2 is a block diagram illustrating a deinterleaving device in a communication system according to an embodiment of the present invention.

FIG. 2 shows a deinterleaver according to an embodiment of the present invention. Referring to FIG. 2, an address generator 211 generates an interleaver memory address for performing a write mode of operation by receiving the interleaver size value N, the first and second variables m and J, and the clock. The address generator 211 provides the generated interleaver memory address to a deinterleaver memory 212. The deinterleaver memory 212 stores input data according to the write address provided from the address generator 211 in a write mode of operation, and sequentially outputs the stored data in a read mode of operation. A counter 213 counts the input clock and provides the clock count value to the deinterleaver memory 212 as a read address value.

As described above, the deinterleaver has the same structure as the interleaver but uses a reverse operation of the interleaver. That is, the deinterleaver is different from the interleaver in that the input/output data is stored and read in reverse order. Therefore, for convenience, the description below will now be made with reference to the interleaver only.

The offset controlled interleaver (OCI) for the turbo encoder according to the present invention is similar in structure to the partial bit reversal interleaver (PBRI) which is disclosed in detail in Korean patent application No. 98-54131, which is hereby incorporated by reference. When an input frame (information symbols+CRC symbols+Information symbols) has a size L, the OCI calculates an offset value OSV which is an N−L value, for the partial bit reversal interleaver size N which is larger than the input frame size L. By using the calculated N as an interleaver size, interleaving is performed in accordance with the partial bit reversal ordering algorithm given by Equation (1) below.

For a given $K \ldots (0 \leq K \leq N-1)$ [Equation 1]

r=K mod J;
PUC=K/J;
s=BRO (PUC);
ADDRESS_READ=r×2$^m$+s

"Interleaving mapping: K+1⇆ADDRESS_READ+1" where 'K' denotes the sequence of output data bits and is referred to as a sequence number; 'm' denotes the number of consecutive zero (0) bits from the LSB (Least Significant Bit), when the calculated interleaver size N is expressed as a binary value, and is referred as a first variable; and J denotes a decimal value for the bits other than the continuing zero (0) bits and is referred to as a second variable. Here, the interleaver size N is defined as 2$^m$×J. For example, for the input data size L=568, the minimum offset value is 8 and thus, the interleaver size N is 576. Since the interleaver size N=576 is expressed as a binary value of N=[1001000000], the first variable m becomes 6 and the second variable J becomes 9. Further, 'mod' and '/' indicate modulo operation and divider operation for calculating the remainder and quotient, respectively. In addition, BRO(H) indicates a bit reversal function for converting 'H' to a binary value and then converting it to a decimal value by reverse ordering the binary value from the MSB (Most Significant Bit) to the LSB. Thereafter, a read address is generated using the determined interleaver size N and the first and second variables m and J, in accordance with Equation (1).

For example, a description will be made of third (K=2) output data with reference to Equation (1). For N=576, m=6 and J=9. Thus, r=2 mod 9=0, and PUC=2/9=0. Further, s=BRO(0)=0. Therefore, the finally calculated read address is ADDRESS_READ=2×2$^6$+0=128. Further, when '1' is added to the read address in order to map the output address from an address 1, the address becomes 129. That is, the third output data is stored at the address 129.

Figure 3:
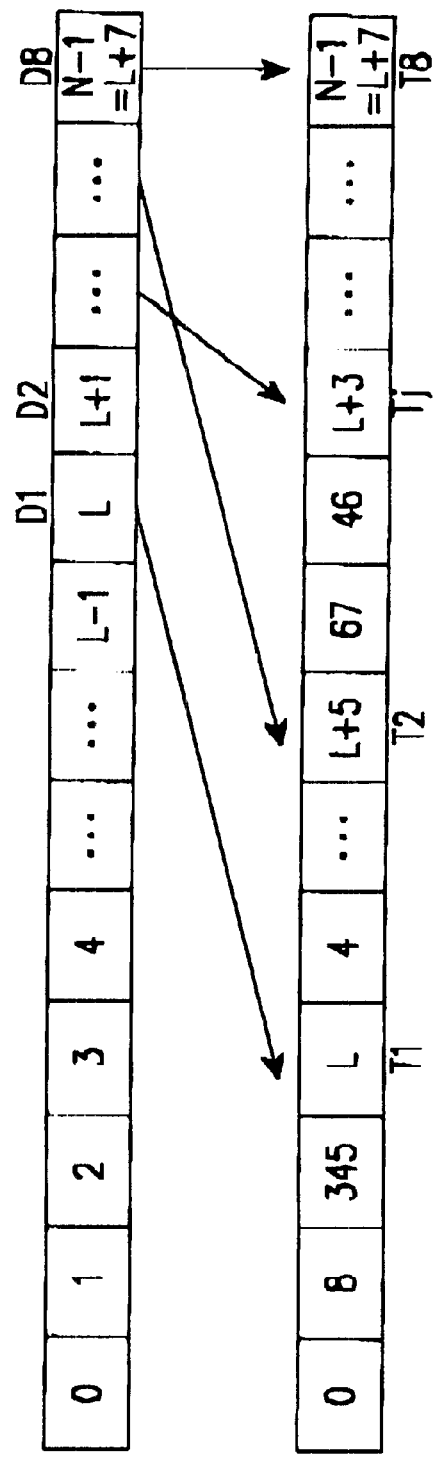
FIG. 3 is a diagram illustrating that symbols corresponding to an offset value exist between interleaved symbols when partial bit reversal ordering interleaving is performed using a virtual address area determined by adding the offset value to a size value of input data.

However, when data is read by addressing the corresponding address of the interleaver memory using the read address generated in accordance with Equation (1), an invalid read address may be generated due to the added offset value. That is, in addition to the read address corresponding to the input data bits [0 . . . L−1], a read address corresponding to the last 8 symbols for the input data bits [L . . . N−1] exists between interleaving sequences. This is illustrated in FIG. 3. When read, N symbols, which are higher in number by 8 than L symbols, to be actually transmitted, will be transmitted. Therefore, the succeeding address should be used after removing the invalid address existing between the interleaving sequences.

Figure 4:
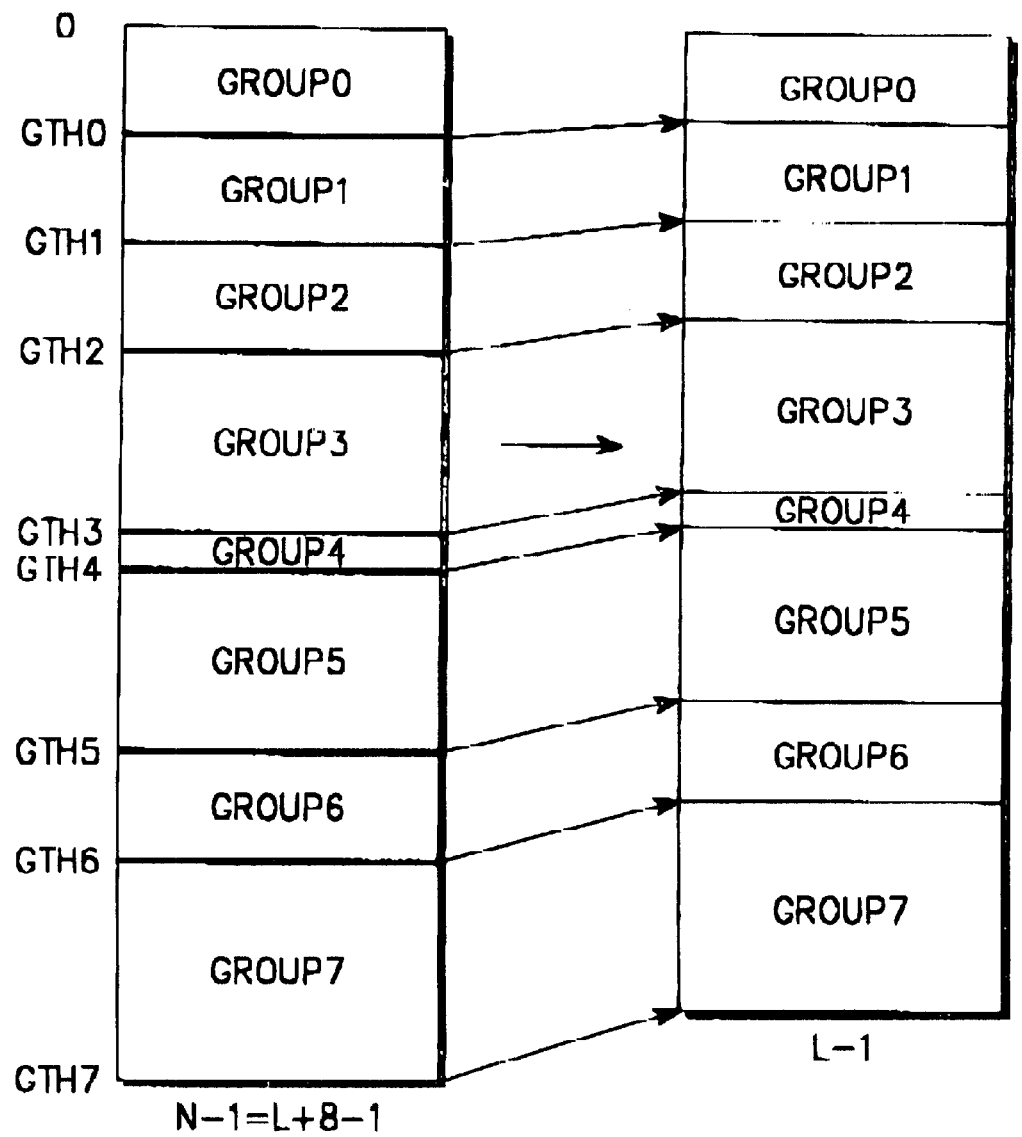
FIG. 4 is a diagram illustrating that output symbols are connected after deleting invalid symbols in FIG. 3.

As illustrated in FIG. 3, when N-partial bit reversal interleaving is used, invalid symbols of L to N−1 exist between the interleaved symbols. Therefore, it is necessary to output the interleaved symbols in succession, except for the invalid symbols. For this, an offset controlled method is used. With regard to the offset controlled method, the read addresses corresponding to the last 8 symbols out of [L . . N−1] are determined as fixed values according to the partial bit reversal interleaving algorithm of Equation (1). First, assume that addresses for 8 tail symbols are D1, D2, D3, . . . , D8 (i.e., L . . . N−1), and each interleaving address corresponding to Di (i=1 . . . 8) is Tk=PIRB(Di), where k=1 . . . 8. Of course, it is not always true that T1<T2 for D1<D2, and the interleaving address is arranged in a given order. Therefore, for convenience, assume that an index controlled to arrange the interleaving address in order of T1<T2<. . .<T8 is defined as 'j' and an address using this is defined as Tj (j=1 . . 8). Then, an interleaving area is divided into 8 groups on the basis of the invalid addresses, and each Tj becomes a threshold (hereinafter, referred as a group threshold value) for distinguishing a boundary thereof. Here, the group threshold value is identical to the invalid address. Therefore, in order to delete the Ti, it is necessary to subtract a given value for the corresponding group from the read address generated using the interleaving algorithm of Equation (1). When the read address belongs to a group 0, '0' is subtracted from the read address, and when the read address belongs to a group 1, '1' is subtracted from the read address, thereby to generate the final read address. FIG. 4 shows a state where the read addresses are newly mapped after removing the invalid addresses using the above offset controlled method.

Therefore, the partial bit reversal interleaving algorithm, for which offset control according to the present invention is taken into consideration, is given by Equation (2) below:

For a given $K \ldots (0 \leq K \leq N-1)$ [Equation 2]

r=K mod J;
PUC=K/J;
s=BRO (PUC);
ADDRESS_READ=r×2$^m$+s
if(0≦ADDRESS_READ<GTH0){ADDRESS_READ-0;}
if(GTH0<ADDRESS_READ<GTH1){ADDRESS_READ-1;}
if{GTH1<ADDRESS_RESD<GTH2){ADDRESS_READ-2;}
if(GTH2<ADDRESS_READ<GTH3){ADDRESS_READ-3;}
if(GTH3<ADDRESS_READ<GTH4){ADDRESS_READ-4;}
if(GTH4<ADDRESS_READ<GTH5){ADDRESS_READ-5;}
if(GTH5<ADDRESS_READ<GTH6){ADDRESS_READ-6;}
if(GTH6<ADDRESS_READ<N-1){ADDRESS_READ-7;}

Figure 5:
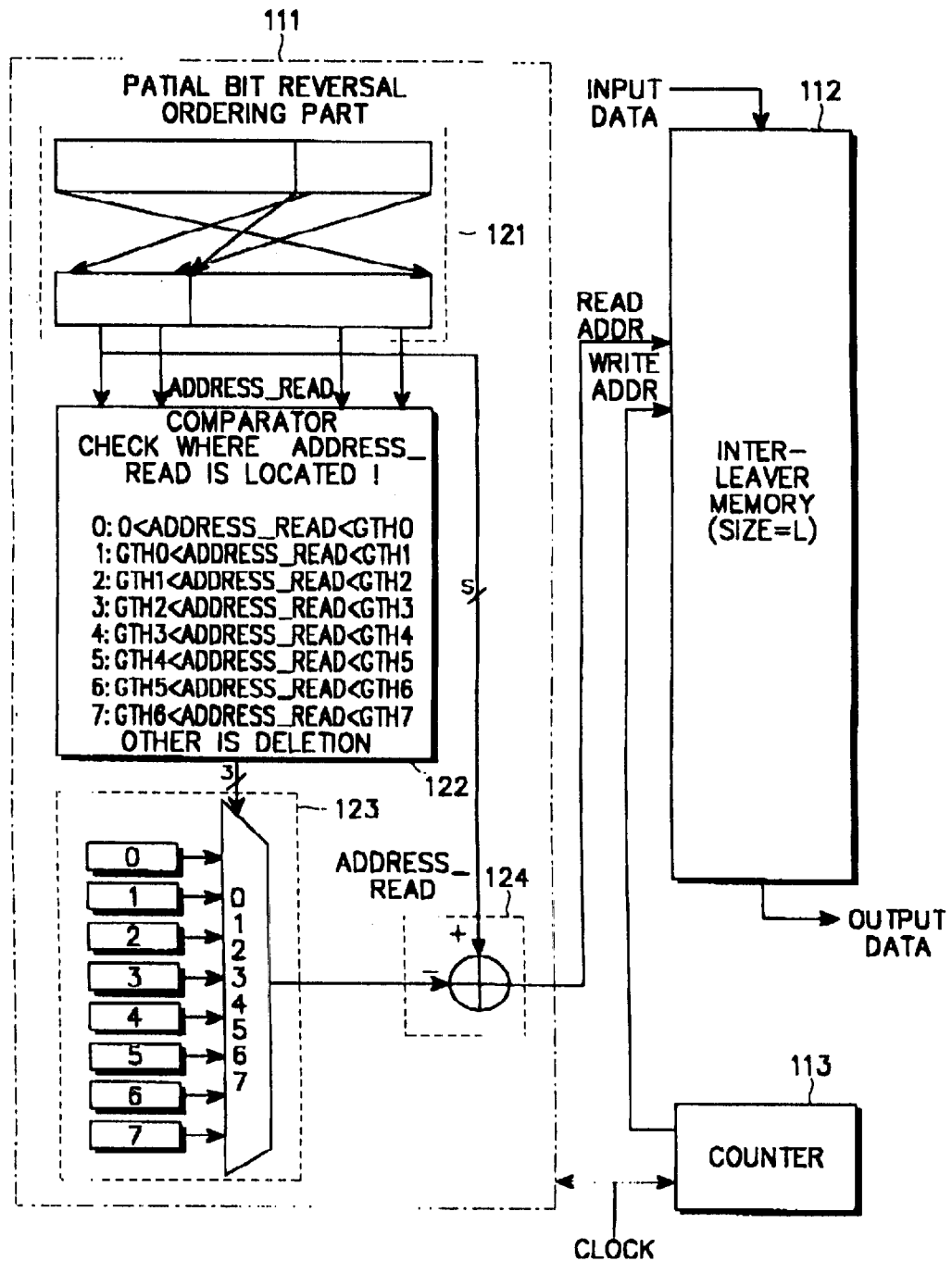
FIG. 5 is a detailed block diagram of a scheme for generating a read address using an offset controlled method according to an embodiment of the present invention.

The algorithm of Equation (2) can be implemented using the hardware structure of FIG. 5. FIG. 5 shows a detailed structure of the address generator 111 of FIG. 1. The address generator 111 is comprised of a partial bit reversal ordering part 121 for generating a first read address by a partial bit reversal interleaving rule, and a puncturer having a comparator 122, a selector 123 and an operator 124 for puncturing an invalid address in the first read address to generate a second read address.

Referring to FIG. 5, the partial bit reversal ordering part 121 generates the first read addresses according to the partial bit reversal interleaving algorithm of Equation (1). The comparator 122 compares the first address output from the partial bit reversal ordering part 121 with the group threshold values GTH0–GTH7 due to the offset values, to determine to which group the first address belongs, and outputs a group select signal for selecting a group value corresponding to the determined group. The selector 123 selects a group value according to the group select signal. The operator 124 subtracts a specific group value of the selector 123 from the first address output from the comparator 122 to generate a second read address, and provides the interleaver memory 112 with the generated second read address. Here, when the first read address output from the partial bit reversal ordering part 121 is identical to any one of the group threshold values, the comparator 122 deletes (or punctures) the first read address.

Figure 6:
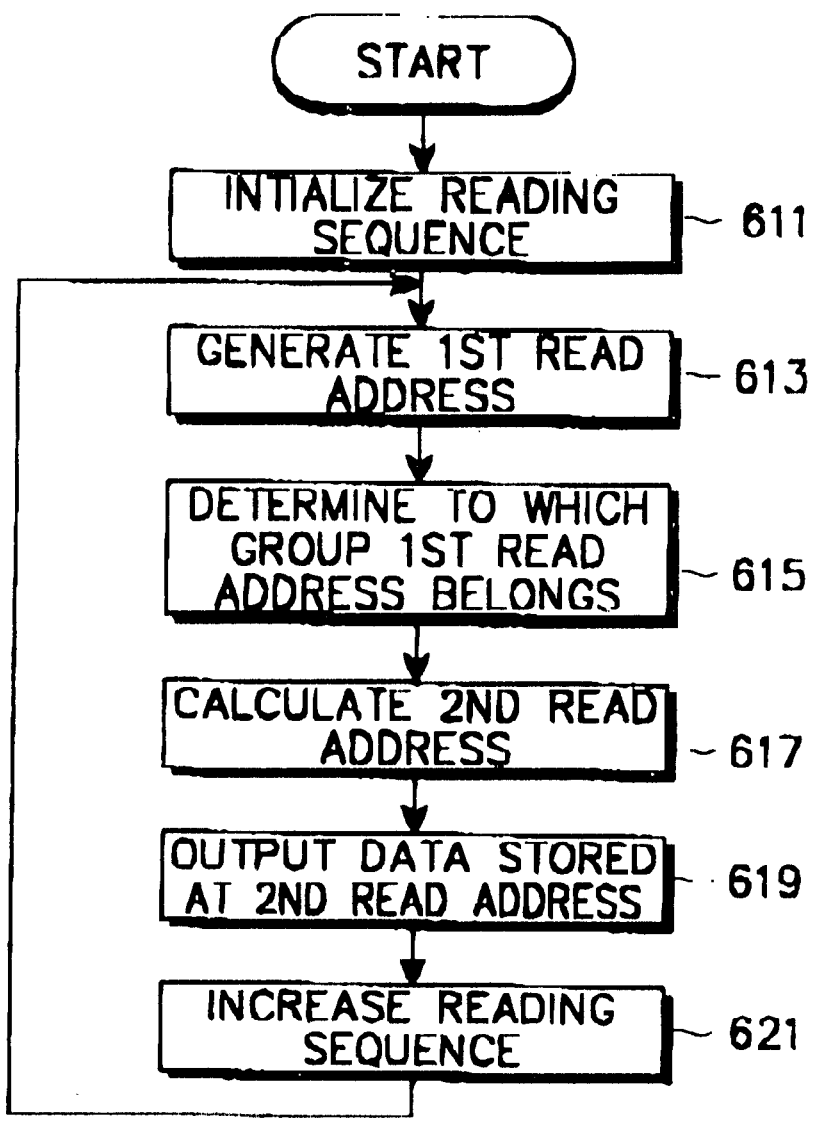
FIG. 6 is a flow chart illustrating a procedure for generating an interleaving read address using an offset controlled method according to an embodiment of the present invention.
Figure 7:
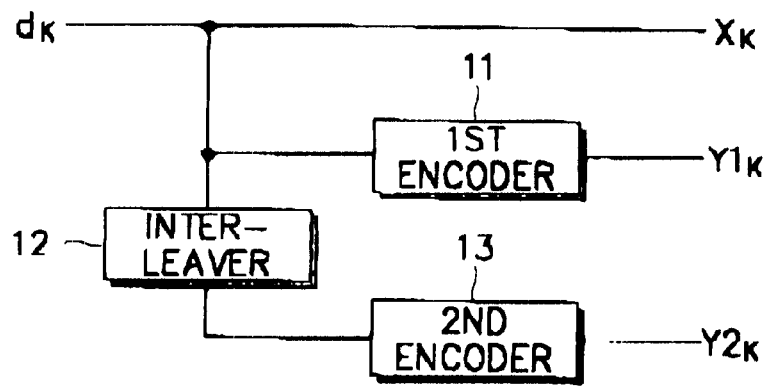
FIG. 7 is a block diagram illustrating a conventional turbo encoder.

Now, a detailed description will be made of the overall operation of the embodiment with reference to FIG. 6.

First, in step 611, the address generator 111 initializes a reading sequence K. Thereafter, in step 613, the address generator 111 generates the first read address using the partial bit reversal interleaving algorithm of Equation (1). Between the first read addresses, there exist invalid addresses due to the offset values. Thus, it is required to perform a process for connecting the read addresses after deleting the invalid addresses. Therefore, in step 615, the address generator 111 compares the first read address with the group threshold values with the offset values, to determine to which group the first read address belongs. Of course, the data for the group threshold values is previously stored in a table. For example, the IMT-2000 system stores a table shown in Table 3 below. Here, the group threshold values are previously determined through the partial bit reversal interleaving algorithm. For example, for the input data size of 568, when the first read address is below 127, the first read address belongs to a group 0 (GTH0); when the first read address is within the range between 127 and 191, it belongs to a group 1 (GTH1); when the first read address is within the range between 191 and 255, it belongs to a group 2 (GTH2); and when the first read address is within the range between 255 and 319, it belongs to a group 3 (GTH3). Thereafter, in step 617, the address generator 111 subtracts a group value of the corresponding group from the first read address to calculate the second read address which is the final interleaving address. For example, when the first read address belongs to group 0, the address generator 111 subtracts a group value '0' of group 0 from the first read address, and when the first read address belongs to group 5, the address generator 111 subtracts a group value '5' from the first read address, thereby calculating the second read address. Further, in step 619, the address generator 111 provides the interleaver memory 112 with the generated second read address to output the symbol data stored at the corresponding address. Finally, in step 621, the address generator 111 increases the reading sequence by '1' and then returns to step 613 to calculate the next read address.

Tables 1 to 3 below show parameters defined according to the input data size, when the novel offset controlled partial bit reversal interleaving scheme is applied to the IMT-2000 system. More specifically, Table 1 shows the offset values according to the input data size, the interleaver size applied to the partial bit reversal ordering algorithm, and the first and second variables m and J required in performing the partial bit reversal ordering algorithm.

TABLE 1

| L (Inf + CRC) | L (Binary) | OSV | N (Decimal) | N (Binary) | J | m | Rate Set |
|---|---|---|---|---|---|---|---|
| Rate Set 1 | | | | | | | |
| 376 | 101111000 | 8 | 384 | 110000000 | 3(11) | 7 | @19.2 kbps |
| 760 | 1011111000 | 8 | 768 | 1100000000 | 3(11) | 8 | @38.4 kbps |
| 1528 | 10111111000 | 8 | 1536 | 11000000000 | 3(11) | 9 | @76.8 kbps |
| 3064 | 101111111000 | 8 | 3072 | 110000000000 | 3(11) | 10 | @153.6 kbps |
| 6136 | 1011111111000 | 8 | 6144 | 1100000000000 | 3(11) | 11 | @307.2 kbps |
| Rate Set 2 | | | | | | | |
| 568 | 1000111000 | 8 | 576 | 1001000000 | 9(1001) | 6 | @28.2 kbps |
| 1144 | 10001111000 | 8 | 1152 | 10010000000 | 9(1001) | 7 | @57.6 kbps |
| 2296 | 100011111000 | 8 | 2304 | 100100000000 | 9(1001) | 8 | @115.2 kbps |
| 4600 | 1000111111000 | 8 | 4608 | 1001000000000 | 9(1001) | 9 | @230.4 kbps |
| 9208 | 10001111111000 | 8 | 9216 | 10010000000000 | 9(1001) | 10 | @460.8 kbps |

TABLE 2

| | N (Binary) | N-1 (Binary) | Upper Counter (J-1) | Lower Counter | Maximum Distance |
|---|---|---|---|---|---|
| Rate Set 1 | | | | | |
| 384 | 110000000 | 101111111 | 10 | b[6:0] | 128 |
| 768 | 1100000000 | 1011111111 | 10 | b[7:0] | 256 |
| 1536 | 11000000000 | 10111111111 | 10 | b[8:0] | 512 |
| 3072 | 110000000000 | 101111111111 | 10 | b[9:0] | 1024 |
| 6144 | 1100000000000 | 1011111111111 | 10 | b[10:0] | 2048 |
| Rate Set 2 | | | | | |
| 576 | 1001000000 | 1000111111 | 1000 | b[5:0] | 64 |
| 1152 | 10010000000 | 10001111111 | 1000 | b[6:0] | 128 |
| 2304 | 100100000000 | 100011111111 | 1000 | b[7:0] | 256 |
| 4608 | 1001000000000 | 1000111111111 | 1000 | b[8:0] | 512 |
| 9216 | 1001000000000 | 1000111111111 | 1000 | b[9:0] | 1024 |

Table 3 below shows the group threshold values GTHi according to the rate sets.

TABLE 3

|  | Rate Set 1 | | | | | Rate Set 2 | | | | | Offset Value |
|---|---|---|---|---|---|---|---|---|---|---|---|
|  | L = 376 | 760 | 1528 | 3064 | 6136 | L = 568 | 1144 | 2296 | 4600 | 9208 | |
| GTH0 | 63 | 127 | 255 | 511 | 1023 | 127 | 255 | 511 | 1023 | 2047 | 0 |
| GTH1 | 127 | 255 | 511 | 1023 | 2047 | 191 | 383 | 767 | 1535 | 3071 | −1 |
| GTH2 | 191 | 383 | 767 | 1535 | 3071 | 255 | 511 | 1023 | 2047 | 4095 | −2 |
| GTH3 | 223 | 447 | 895 | 1791 | 3583 | 319 | 639 | 1279 | 2559 | 5119 | −3 |
| GTH4 | 255 | 511 | 1023 | 2047 | 4095 | 383 | 767 | 1535 | 3071 | 6143 | −4 |
| GTH5 | 319 | 639 | 1279 | 2559 | 5119 | 447 | 895 | 1791 | 3583 | 7167 | −5 |
| GTH6 | 351 | 703 | 1407 | 2815 | 5631 | 511 | 1023 | 2047 | 4095 | 8191 | −6 |
| GTH7 | 383 | 767 | 1535 | 3071 | 6143 | 575 | 1151 | 2303 | 4607 | 9215 | −7 |

As described above, the novel offset controlled interleaving method can perform interleaving even though the interleaver size cannot be expressed in terms of the power of 2. Further, a separate address for interleaving is not required, thereby contributing to a reduction in the hardware complexity of the system. In addition, the interleaver/deinterleaver has a simple transmission scheme and requires an interleaver memory having a capacity for the frame size of L bits, thus increasing memory utilization efficiency. Furthermore, the novel interleaver has an excellent distance property.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An interleaving method comprising the steps of:
   storing input data in a memory according to a sequential address;
   providing a virtual address determined by adding a predetermined value to a size of the input data so that a partial bit reversal ordering interleaving rule is satisfied;
   matching the virtual address to an interleaved address according to the partial bit reversal ordering interleaving rule; and
   reading the input data stored in the memory by interleaving according to the partial bit reversal ordering interleaving rule so that an address other than the corresponding predetermined value is addressed.

2. The interleaving method as claimed in claim 1, wherein the predetermined value is a value to be added to the size of the input data so that a size of the virtual address becomes a multiple of $2^m$ where m denotes the number of consecutive zero bits from the least significant bit when the size of the virtual address is expressed as a binary value.

3. An interleaving device comprising:
   a memory for sequentially storing input data;
   an address generator having a virtual address area determined by adding a predetermined value to a size of the input data so that a partial bit reverssal ordering interleaving rule is satisfied, for generating a first read address from the virtual address area according to the partial bit reversal ordering interleaving rule; and
   a puncturer for puncturing an address corresponding to the predetermined value from the first read address to generate a second read address,
   wherein the interleaving device reads the input data from the memory using the second read address.

4. The interleaving device as claimed in claim 3, wherein the puncturer comprises:
   a comparator for dividing the virtual address area into a plurality of groups according to an address corresponding to the predetermined value, determining to which one of the plurality of groups the first read address belongs to output a group select signal, and deleting the address corresponding to the predetermined value from the first read address;
   a selector for receiving the group select signal from the comparator and generating a specific value to an operator; and
   an operator for subtracting a specific value corresponding to the group select signal from the first read address to generate the second read address.

5. The interleaving device as claimed in claim 3, wherein the address generator comprises:
   a look-up table for providing first and second variables m and J satisfying a size, $N=2^m \times J$, of the virtual address; and
   a generator for generating the first read address using the first and second variables m and J provided from the look-up table, in accordance with an equation expressed as:

$2^m(K \bmod J)+BRO(K/J)$ where K ($0 \leq K \leq N-1$) denotes the reading sequence and BRO denotes a function of converting a binary value to a decimal value by bit reversing.

6. An interleaving method comprising the steps of:
   storing input data in a memory according to a sequential address;
   providing a virtual address area determined by adding a predetermined value to a size of the input data so that a partial bit reversal ordering interleaving rule is satisfied, and generating a first read address in the virtual address area according to the partial bit reversal ordering interleaving rule;
   puncturing an address corresponding to the predetermined value from the first read address, to generate a second read address; and
   reading the input data from the memory using the second read address.

7. The interleaving method as claimed in claim 6, wherein the puncturing step comprises the steps of:
   dividing the virtual address area into a plurality of groups according to an address corresponding to the predetermined value, and determining to which group the first read address belongs;

deleting the address corresponding to the predetermined value from the first read address; and subtracting a specific value corresponding to the determined group from the first read address to generate the second read address.

8. The interleaving method as claimed in claim 6, wherein the address generating step comprises the steps of:

providing first and second variables m and J satisfying a size, $N=2^m \times J$, of the virtual address; and generating the first read address using the first and second variables m and J, in accordance with an equation expressed as:

$$2^m(K \bmod J) + BRO(K/J)$$

where K ($0 \leq K \leq N-1$) denotes the reading sequence and BRO denotes a function of converting a binary value to a decimal value by bit reversing.

* * * * *